United States Patent [19]

Schroeder et al.

[11] 4,061,933
[45] Dec. 6, 1977

[54] CLOCK GENERATOR AND DELAY STAGE

[75] Inventors: Paul R. Schroeder, Dallas; Robert J. Proebsting, Richardson, both of Tex.

[73] Assignee: Mostek Corporation, Carrollton, Tex.

[21] Appl. No.: 644,855

[22] Filed: Dec. 29, 1975

[51] Int. Cl.² .................. H03K 5/13; H03K 1/12; H03K 19/08
[52] U.S. Cl. ..................... 307/262; 307/208; 307/246; 307/269; 307/270; 307/DIG. 4
[58] Field of Search ............... 307/205, 214, 208, 251, 307/269, 270, 246, 262, DIG. 1, DIG. 4

[56] References Cited

U.S. PATENT DOCUMENTS

| 3,641,366 | 2/1972 | Fujimoto | 307/205 X |
|---|---|---|---|
| 3,641,370 | 2/1972 | Heimbigner | 307/205 X |
| 3,660,684 | 5/1972 | Padgett et al. | 307/270 |
| 3,898,479 | 8/1975 | Proebsting | 307/246 X |
| 3,906,464 | 9/1975 | Lattin | 307/DIG. 4 X |
| 3,932,773 | 1/1976 | Lüscher et al. | 307/DIG. 4 X |
| 3,937,983 | 2/1976 | Reed | 307/270 X |

*Primary Examiner*—John S. Heyman
*Assistant Examiner*—Larry N. Anagnos
*Attorney, Agent, or Firm*—Hubbard, Thurman, Turner

[57] ABSTRACT

A clock generator for an MOSFET integrated circuit having a plurality of cascaded delay stages is disclosed. Each delay stage includes a bootstrap inverter having first and second transistors connected in series between the drain supply voltage and a source supply voltage, thus forming a first node between the transistors. The first node is capacitively coupled to a bootstrap node which is connected to the gate of the first transistor. The bootstrap node is also coupled through the channel of a third transistor to an input. The gate of the third transistor forms a third node. Circuit means are provided for precharging the third node and then isolating the third node while an input signal is applied through the third transistor to the bootstrap node so that the third node is also bootstrapped up to permit rapid charging of the bootstrap node to the full voltage of the input signal. The second transistor is held on by a precharge signal so that the first node is held low until the bootstrap node has been charged to the input voltage. Then both the third node and the gate of the second transistor are discharged to turn the second and third transistors off, thus permitting the bootstrap node to go rapidly above the drain supply voltage. The bootstrap node may be used directly as output, or can drive the gate of an output transistor so as to produce a very rapidly rising output which quickly reaches the full drain supply voltage. Circuit means is also provided to discharge the third node to disable the output before an input signal occurs. Since the third node is automatically discharged after receiving an input, the input may subsequently be changed without changing the output. Circuit means is also provided to selectively discharge the bootstrap node to isolate the output after it has achieved maximum voltage, so that the output can be capacitively boosted above the drain supply voltage. A circuit is also provided to reset the output to zero volts in conjunction with isolation of the output. A clock generator employing the various functions of a plurality of cascaded delay stages is also disclosed to demonstrate the capabilities of producing a series of clock pulses which go to $V_{DD}$ in timed sequence in response to input signal, of producing a voltage substantially above $V_{DD}$, and of producing a pulse of predetermined duration.

27 Claims, 6 Drawing Figures

CLOCK GENERATOR AND DELAY STAGE

This invention relates generally to MOSFET integrated circuits, and more particularly relates to a delay stage and clock generator for use in data processing circuits.

U.S. Pat. No. 3,898,479, issued to Robert J. Proebsting on Mar. 1, 1973, discloses a clock generator comprised of a plurality of bootstrap stages for producing a series of clock edges which transition to the full drain supply voltage in timed sequence. This circuitry has been utilized with success in commercial applications to automatically initiate a sequence of logic functions in an integrated MOSFET circuit. The present invention is concerned with a similar delay stage having substantially improved performance and versatility. In particular, the stage of the present invention has the capability of producing a transition from the source supply voltage to the full drain supply voltage in a shorter period of time, i.e., with a faster rise time. Additionally, the delay stage has the added functional versatility of not requiring that the input signal remain at a high level in order to maintain a high level output, provides for a means of disabling the stage from producing an output in response to an input between the termination of a precharge signal and the reception of the input signal, provides a means for isolating the output such that the output can be capacitively boosted above $V_{DD}$, and provides for the resetting of the output from the high level to the low level without regard to the state of the input signal at any time. All of these additional functions are accomplished without consuming any D.C. power.

More particularly, the delay stage in accordance with the present invention comprises first and second transistors connected in series between a drain supply voltage and source supply voltage and forming a first node therebetween. The gate of the first transistor forms a second node which is capacitively coupled to the first node. The second node is connected through the channel of a third transistor to an input node. The gate of the third transistor forms a third node with a gate of the second transistor forming a fourth node. Circuit means is provided for first precharging the third and fourth nodes to some voltage near the drain supply voltage so that second and third transistors are turned on. The second transistor, when turned on, discharges the first node and circuit means is also provided for discharging the second node during the precharge period. Circuit means responsive to an input signal on the input node holds the charge on the third node so that the third node is progressively bootstrapped well above the input voltage so that the second node is rapidly charged until the second node has been charged substantially to the input voltage. Then both the third and fourth nodes are automatically discharged to turn the second and third transistors off, thus causing the second node to be bootstrapped above the drain supply voltage as the first node is charged by the first transistor in response to the second transistor turning off.

In accordance with another aspect of the invention, circuit means are provided for discharging the third node after it has been precharged but before an input signal occurs so that the delay stage is disabled from producing an output signal in response to an input signal.

In accordance with another aspect of the invention, a fifth transistor is provided to couple the drain supply voltage to an output node, and the gate of the fifth transistor is connected to the second node. Circuit means are also provided for discharging the second node in response to an externally applied signal after an output is produced to thereby turn the fifth transistor off and isolate the output from the drain supply voltage.

In accordance with still another aspect of the invention, the output is connected by a sixth transistor to ground with the gate of the sixth transisor connected to the fourth node so that the sixth transistor is turned off to allow the output to go to the drain supply voltage. Additional circuit means is provided for discharging the output to the source supply voltage in response to an external reset signal.

In accordance with still another aspect of the invention, a fourth transistor connects the third node to the fourth node for purposes of isolating the third node to thus permit the third node to be bootstrapped above the drain supply voltage by the stray capacitance of the third transistor. In the latter case, the gate of the fourth transistor may be connected to a source of voltage corresponding to the drain supply voltage. Circuit means are provided for discharging the fourth, and thus the third node through the fourth transistor, a short time after the input voltage transitions toward the drain supply voltage.

The novel features believed characteristic of this invention are set forth in the appended claims. The invention itself, however, as well as other objects and advantages thereof, may best be understood by reference to the following detailed description of illustrative embodiments, when read in conjunct with the accompanying drawings, wherein:

Figure 1:
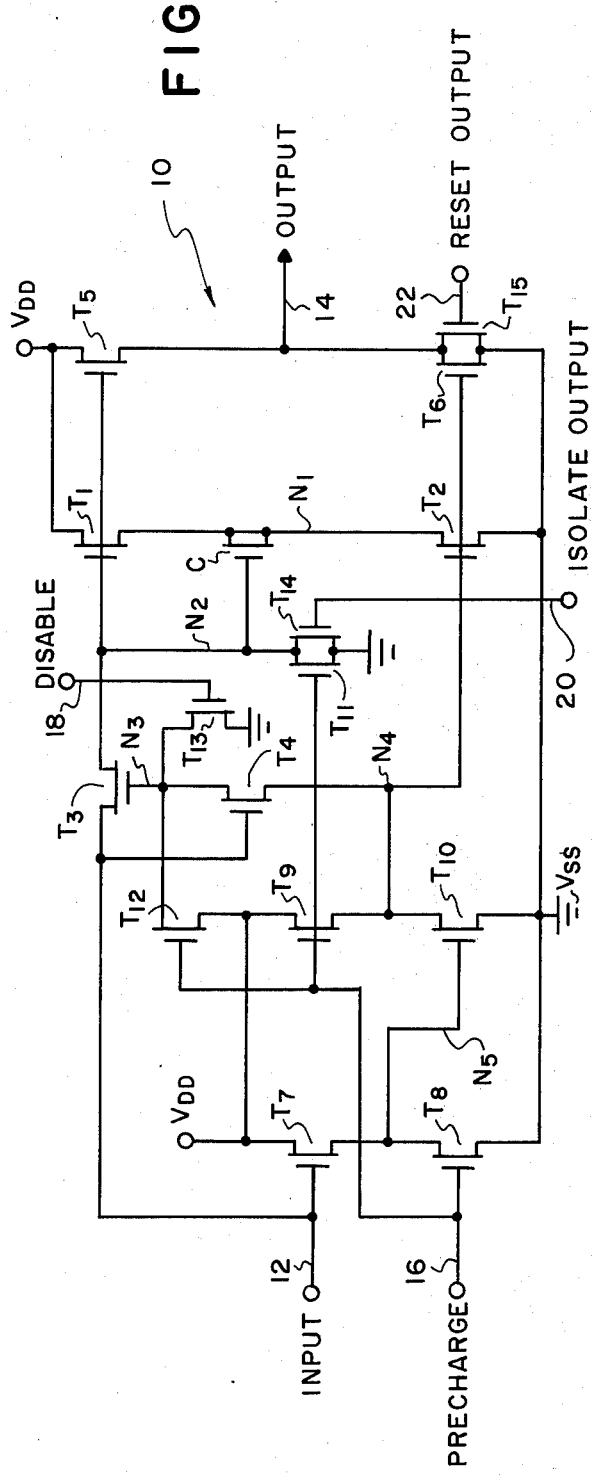
FIG. 1 is a schematic circuit diagram of a delay stage in accordance with the present invention.

Referring now to the drawings, a delay stage in accordance with the present invention is indicated generally by the reference numeral 10 in FIG. 1. The delay stage is comprised of transistors $T_1$ and $T_2$, the channels of which are connected in series between a drain supply voltage $V_{DD}$ and source supply voltage $V_{SS}$, which is represented by the conventional ground symbol in all of the drawings. The source node of transistor $T_1$ and the drain node of transistor $T_2$ form a common node $N_1$ which is capacitively coupled by capacitor C to a node $N_2$. The node $N_2$ includes the gate of transistor $T_1$. The channel of a transistor $T_3$ connects node $N_2$, and thus the gate of transistor $T_1$, to an input terminal 12 for the delay stage. The gate of transistor $T_3$ forms a second bootstrap node $N_3$ and is connected by transistor $T_4$ to a node $N_4$ which includes the gate of transistor $T_2$. An output transistor $T_5$ connects the drain supply voltage $V_{DD}$ to an output terminal 14 of the delay stage and transistor $T_6$ connects the output node 14 to the source supply voltage. The gate of transistor $T_5$ forms a part of node $N_2$ and the gate of transistor $T_6$ forms a part of node $N_4$. Transistors $T_7$ and $T_8$ are connected in series between the drain supply voltage $V_{DD}$ and the source supply voltage. The source of transistor $T_7$ and the drain of transistor $T_8$ form part of a common node $N_5$. The gate of transistor $T_7$ is the terminal 12. Transistors $T_9$ and $T_{10}$ are also connected in series between the drain supply voltage $V_{DD}$ and the source supply voltage with the source of transistors $T_9$ and the drain of transistor $T_{10}$ forming a part of node $N_4$. The gate of transistor $T_{10}$ forms a part of node $N_5$. Transistor $T_{11}$ connects node $N_2$ to the source supply voltage for purposes of discharging node $N_2$ to ground during precharge. Transistor $T_{12}$ provides a means for precharging node $N_3$ and is connected between the drain supply voltage $V_{DD}$ and node $N_3$. The gates of transistors $T_8$, $T_9$, $T_{11}$ and $T_{12}$ are all connected to a precharge input 16. Disable transistor $T_{13}$ connects node $N_3$ to the source supply voltage, and the gate provides a disable input 18 for the delay stage. Transistor $T_{14}$ also connects node $N_2$ to the source supply voltage. When transistor $T_{14}$ is turned on, node $N_2$ is discharged, thus turning transistor $T_5$ off and isolating the output 14. Accordingly, the gate of transistor $T_{14}$ is designated as an input 20 for isolating the output of the delay stage. Transistor $T_{15}$ connects the output 14 to the source supply voltage and the gate of transistor $T_{15}$ provides an input 22 for resetting the output 14 to the source supply voltage level as will presently be described.

Figure 2:
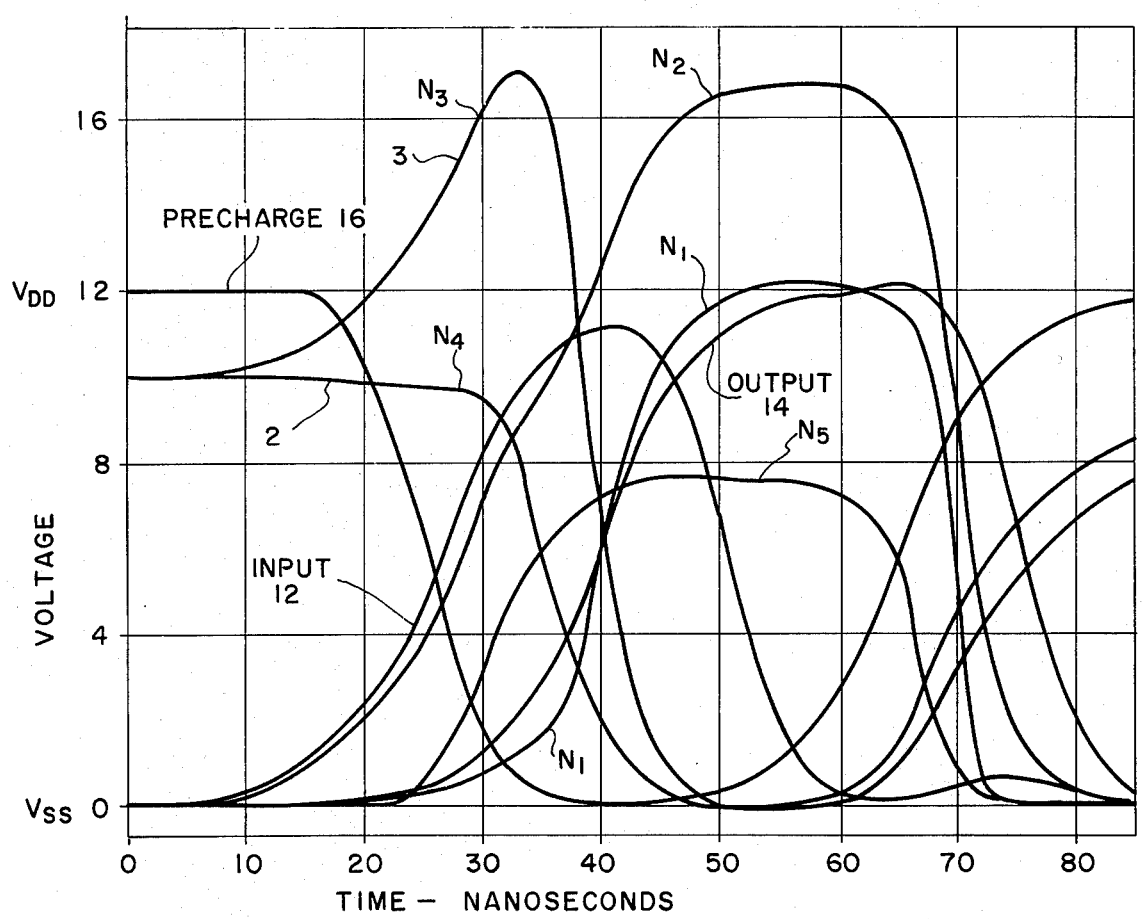
FIG. 2 is a computer generated plot of voltage at various nodes in the circuit of FIG. 1 with respect to time which serves to illustrate the operation of FIG. 1.

The operation of the delay stage 10 may best be understood by referring to FIG. 2. FIG. 2 illustrates the voltage level on the various nodes $N_1 - N_5$ as well as on precharge node 16, input node 12 and output node 14, and the curves are designated by the same reference characters as the corresponding nodes in FIG. 1. The vertical scale is in volts with the drain supply voltage $V_{DD}$ at 12 volts and the source supply voltage $V_{SS}$ at zero volts. In the preferred embodiment, N-channel transistors are used so that $V_{DD}$ is positive with respect to $V_{SS}$, although this relationship would be reversed for P-channel circuits. In this type of circuit, transistors typically have a threshold of about 2.0 volts, which means that a transistor conducts only when the gate voltage exceeds the source voltage by at least 2 volts. Time is indicated horizontally from 0 to 80 nanoseconds. The precharge period terminates at approximately 15 nanoseconds and begins again at approximately 70 nanoseconds. It will be noted that a complete output pulse including the desired delay from the input signal, the rise of the output to $V_{DD}$ and the fall back to $V_{SS}$ occurs in approximately 65 nanoseconds. This occurs in approximately one-half the time required for the output signal to rise from $V_{SS}$ to $V_{DD}$ in the delay stage disclosed in the above referenced patent, demonstrating the superior speed characteristics of the present circuit, although the previous circuit rose to a higher voltage level in the illustrated example. Stated in terms of rise time, the present circuit is approximately twice as fast.

When the voltage on precharge input 16 is at $V_{DD}$, nodes $N_3$ and $N_4$ are precharged to approximately 10 volts as a result of the threshold drop through transistors $T_{12}$ and $T_9$, respectively, which are turned on by the precharge voltage. Nodes $N_1$, $N_2$ and $N_5$ are held at $V_{SS}$ because transistors $T_2$, $T_{11}$ and $T_8$, respectively, are turned on. The input terminal 12 is also at $V_{SS}$ and the output terminal 14 is at $V_{SS}$ because the high voltage on node $N_4$ turns transistor $T_6$ on. The voltage on precharge input 16 is then transitioned from $V_{DD}$ to $V_{SS}$ beginning at about 15 nanoseconds and terminating at approximately 35 nanoseconds, while the input 12 is transitioned from $V_{SS}$ volts to about 11 volts between about 10 nanoseconds and about 40 nanoseconds. Since node $N_2$ is at $V_{SS}$ and node $N_3$ is at about 10 volts, transistor $T_3$ is turned on by a large gate-to-source voltage differential. As a result, node $N_2$ is charged substantially simultaneously with input 12 as represented between 10 nanoseconds and about 38 nanoseconds. At the same time, node $N_3$ is self-bootstrapped up by the gate-channel capacitance of $T_3$ as represented between about 10 and about 35 nanoseconds since transistor $T_4$ does not conduct until the voltage on input 12 exceeds the voltage on node $N_4$ by one threshold which occurs at about 35 nanoseconds. Node $N_4$ begins to be discharged at about 30 nanoseconds as a result of node $N_5$ exceeding $V_{SS}$ by a threshold which occurs at about 28 nanoseconds. Then as node $N_4$ is discharged through transistor $T_{10}$, node $N_3$ is also discharged through transistors $T_4$ and $T_{10}$. As node $N_4$ is discharged between about 30 and about 50 nanoseconds, node $N_1$ begins to be charged at a high rate beginning at about 35 nanoseconds until about 50 nanoseconds, thus bootstrapping node $N_2$ substantially above $V_{DD}$ as a result of capacitor C. The bootstrap node $N_2$ continues to hold transistor $T_1$ on even as node $N_1$ is charged completely to $V_{DD}$ and also turns output transistor $T_5$ on to the same extent so that the output node 14 very rapidly goes from $V_{SS}$ to $V_{DD}$ between about 25 and about 60 nanoseconds.

In the illustration of FIG. 2, the voltage on the input terminal is brought back down to $V_{SS}$ before reaching full $V_{DD}$ beginning at about 40 nanoseconds and is back at $V_{SS}$ volts at about 60 nanoseconds. The voltage on the precharge terminal may be returned to $V_{DD}$ at any later time but is illustrated as returning to $V_{DD}$ between about 50 nanoseconds and about 85 nanoseconds to cause the output 14, node $N_2$, node $N_1$, and node $N_5$ to very rapidly return to $V_{SS}$. Nodes $N_3$ and $N_4$ are then recharged to about 10 volts in preparation for another output cycle.

The circuit 10 may be disabled from disabled from producing a positive going transition at the output 14 after the precharge terminal 16 has been taken to 12 volts by applying a positive voltage to the DISABLE terminal 18 to turn transistor 13 on, thus discharging node $N_3$. It is preferable for the precharge signal to first turn off so that a D.C. current path is not provided through transistors $T_{12}$ and $T_{13}$ between $V_{DD}$ and ground. Discharging node $N_3$ to $V_{SS}$ turns transistor $T_3$ off so that the input voltage cannot reach node $N_2$, thus disabling the output node 14. The output terminal 14 can be isolated from both $V_{DD}$ and $V_{SS}$ after it has been driven to $V_{DD}$ by applying a positive voltage to ISOLATE OUTPUT terminal 20 to turn transistor $T_{14}$ on. This discharges node $N_2$, turning transistor $T_5$ off. Since transistor $T_6$ has also been turned off by the discharge of node $N_4$, output 14 is isolated from both supply voltages and thus can be capacitively boosted above the drain supply voltage as desired. This is useful for producing a clock signal in excess of the drain supply voltage as will presently be described in connection with the description of the circuit of FIG. 5.

The output terminal 14 can be reset to $V_{SS}$ from $V_{DD}$ by applying a signal to both the ISOLATE OUTPUT terminal 20 and the RESET OUTPUT terminal 22 to turn both transistors $T_{14}$ and $T_{15}$ on. $T_{14}$ again discharges node $N_2$ to $V_{SS}$ to turn transistor $T_5$ off, and transistor $T_{15}$ discharges output node 14 to the source supply voltage, bypassing transistor $T_6$.

It is important to note that the voltage on output node 14 is independent of the voltage on the input node 12 after node $N_3$ has been automatically discharged by the operation of transistors $T_4$ and $T_{10}$. Thus the input 12 may be returned to $V_{SS}$ without affecting the voltage level on the output terminal 14. Similarly, the voltage level of the output 14 may be returned to $V_{SS}$ by signals to terminals 20 and 22 without regard to the voltage level on input terminal 12.

It will be appreciated that any one, several, or all of transistors $T_{13}$, $T_{14}$ and $T_{15}$ can be eliminated from the circuit when the respective function is not required.

Figure 3:
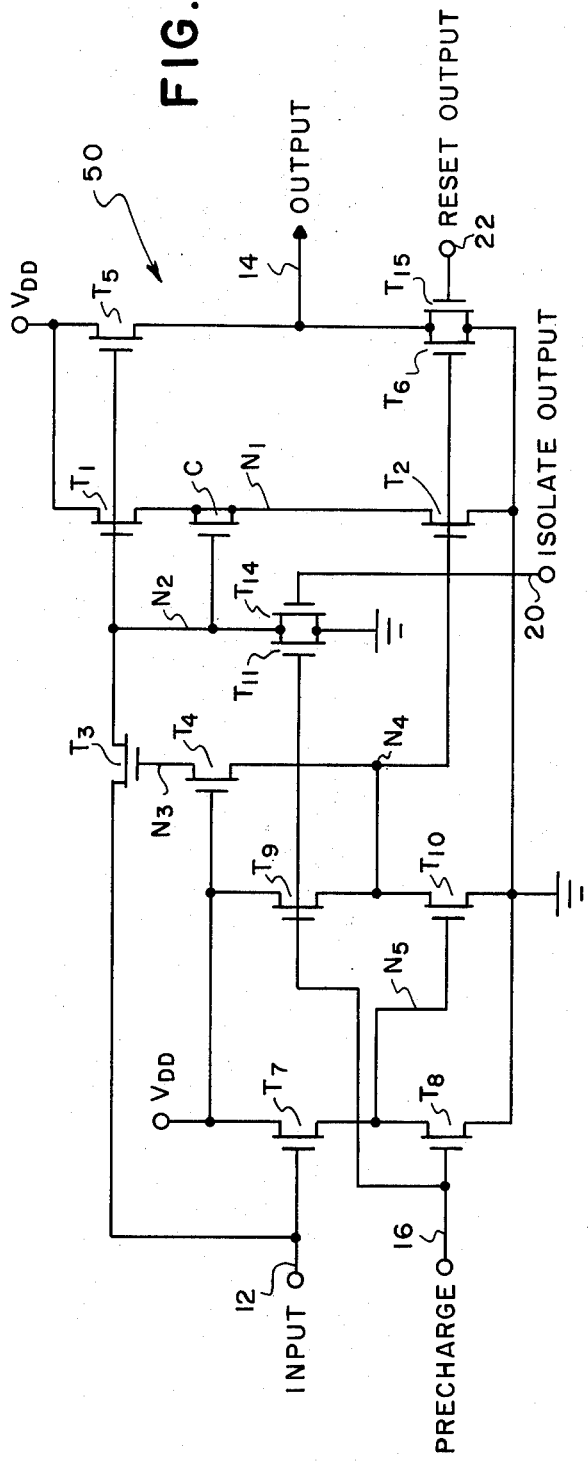
FIG. 3 is a schematic circuit diagram of another delay stage in accordance with the present invention.

Another delay stage in accordance with the present invention is indicated generally by the reference numeral 50 in FIG. 3. The delay stage 50 is substantially identical to delay stage 10 except for the manner in which node $N_3$ is precharged and corresponding components are therefore designated by the same reference characters. The delay stage 50 differs from the delay stage 10 only in that transistors $T_{12}$ and $T_{13}$ are eliminated and that the gate of transistor $T_4$ is connected to $V_{DD}$, rather than to the input terminal 12. The delay stage 50 has the advantage of utilizing fewer components but does not have the capability of being disabled after precharge and before an input signal. In addition, the delay stage 50 is more dependent on a complete precharge of nodes $N_4$ and $N_3$. As mentioned, delay stage 50 functions in essentially the same manner as delay stage 10 except that node $N_3$ is precharged through transistors $T_9$, node $N_4$ and transistor $T_4$ during the precharge period. Both nodes $N_3$ and $N_4$ are charged to a voltage one threshold below $V_{DD}$. As a result, node $N_3$ can still be self-bootstrapped substantially above the voltage on input 12 as the voltage on input 12 increases because transistor $T_4$ cannot conduct appreciably until node $N_4$ is discharged by conduction of transistor $T_{10}$ a short delay behind the rise of voltage on the input terminal 12. However, it will be noted that delay stage 50 does not function as well when the precharge signal on input 16 does not reach a full $V_{DD}$ level, or does not hold the $V_{DD}$ level for a sufficient period of time to fully precharge node $N_3$. This is because node $N_3$ can only be precharged to one threshold below the voltage of the precharge signal on input 16. Thus, if the precharge signal does not go all the way to $V_{DD}$ for a sufficient period of time to precharge node $N_4$ to one threshold below $V_{DD}$, transistor $T_4$ will be slightly conductive. This is of no consequence during precharge because nodes $N_3$ and $N_4$ are at the same voltage level. However, slight conductance of transistor $T_4$ does prevent node $N_3$ from self-bootstrapping to the full extent otherwise possible because of the conductance of transistor $T_4$ during the self-bootstrapping period. The delay stage 10 is immune to this problem because transistor $T_4$, which isolates node $N_3$, cannot conduct until the voltage on input 12 exceeds the voltage on node $N_4$ by one threshold, thus assuring that node $N_3$ will be bootstrapped substantially to the maximum possible.

Figure 4:
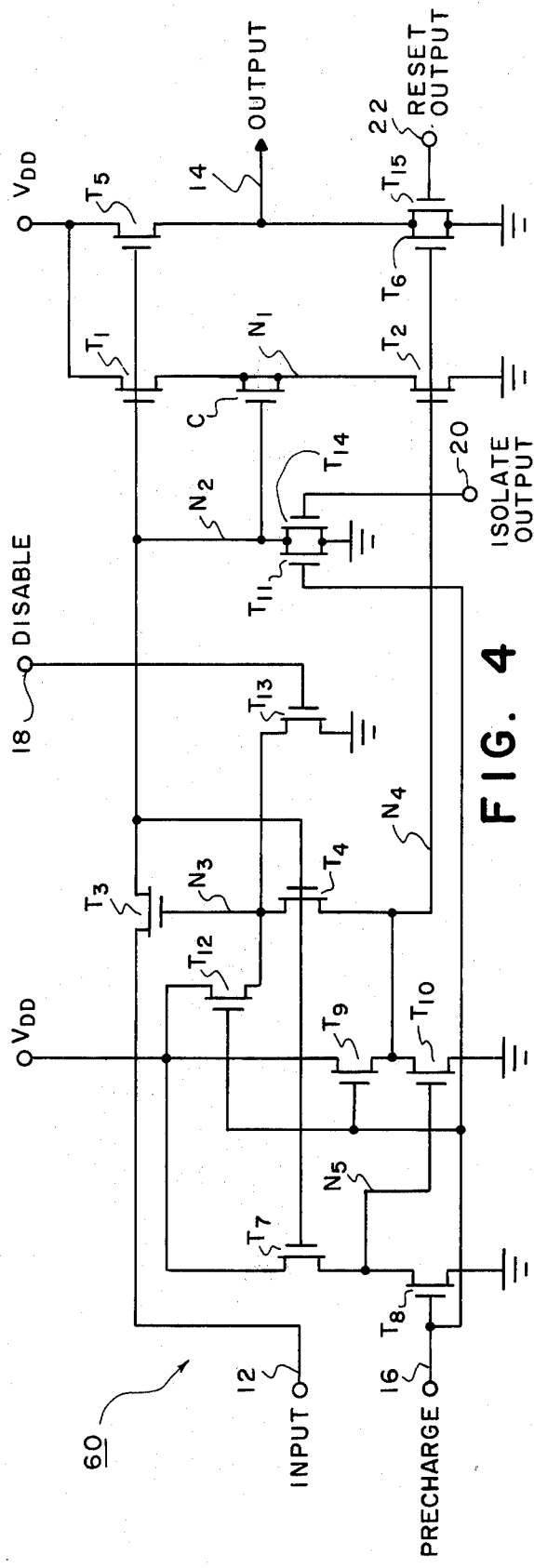
FIG. 4 is a schematic circuit diagram of still another delay stage in accordance with the present invention.

Another delay stage in accordance with the present invention is indicated generally by the reference numeral 60 in FIG. 4. The delay stage 60 is similar to the delay stage 10 and accordingly corresponding components are designated by the same reference characters. The difference between the delay stage 60 and the delay stage 10 is that the gates of transistors $T_4$ and $T_7$ are connected to node $N_2$ rather than to the input terminal 12. The operation of the delay stage 60 is identical to that of the delay stage 10 because node $N_2$ is substantially coincident with the input 12 during the time interval from 10 nanoseconds to about 35 nanoseconds, and then remains positive until node $N_2$ is discharged, which is all that is required for the proper operation of transistors $T_4$ and $T_7$. The advantage of the configuration of the delay stage 60 is that when a disable pulse is applied to terminal 18 prior to an input signal, the gates of transistors $T_4$ and $T_7$ are isolated from input terminal 12, thereby causing transistors $T_4$ and $T_7$ to remain off even when an input pulse is applied to input 12. Consequently, node $N_4$ will remain at its high precharge voltage since node $N_5$ remains at $V_{SS}$ and transistor $T_{10}$ remains OFF. The high voltage level on node $N_4$ in turn causes output transistor $T_6$ to remain ON, thereby providing a low impedance conducting path between output terminal 14 and source supply $V_{SS}$. This "clamping" action is desirable in most applications and is not provided without additional circuitry by the delay stages 10 or 50 of FIGS. 1 and 3, respectively.

Figure 5:
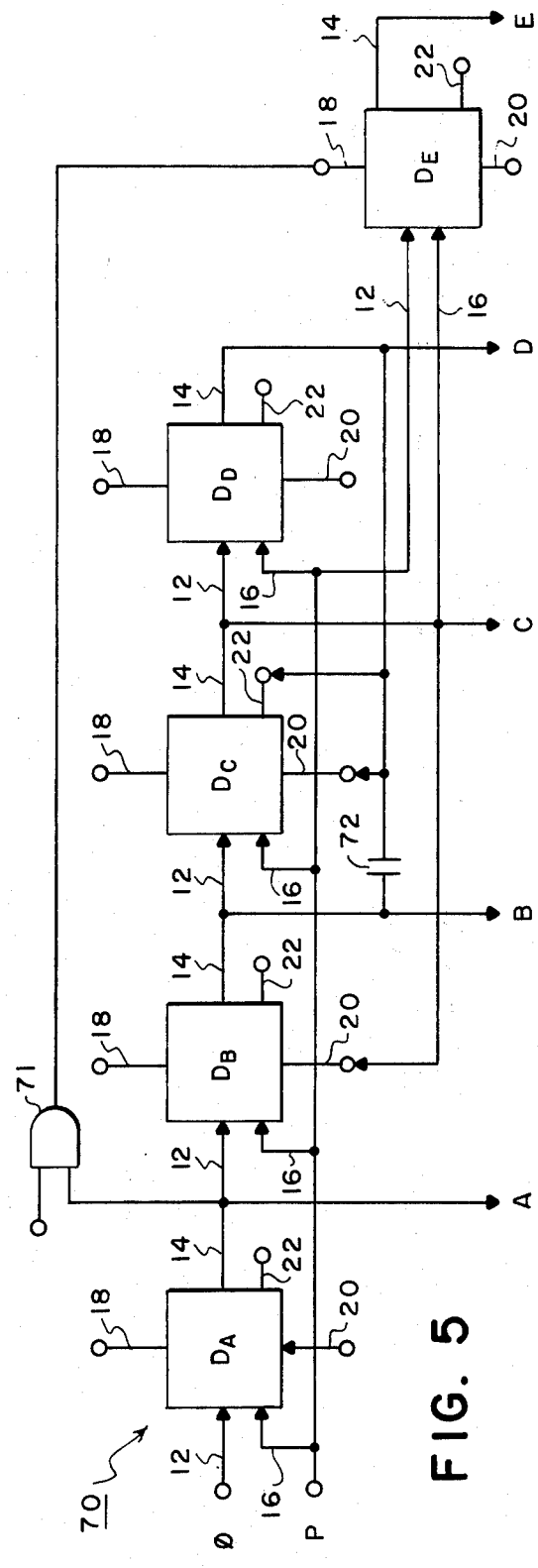
FIG. 5 is a block diagram illustrating a clock system utilizing a plurality of cascaded delay stages in accordance with the present invention.

A clock system in accordance with the present invention is indicated generally by the reference numeral 70 in FIG. 5. The clock system 70 is comprised of five delay stages $D_A$, $D_B$, $D_C$, $D_D$, and $D_E$ in accordance with this invention. The output 14 of each stage is connected to the input 12 of each succeeding stage in a cascaded configuration as illustrated, except for stage $D_E$. The input of stage $D_E$ is the precharge signal and the precharge signal is the output of delay stage $D_C$. In addition, stage $D_E$ may be disabled by the output of stage $D_A$ when combined with an external logic event by gate 71, the output of which is connected to disable input 18 of stage $D_E$. A single precharge signal may be applied to all four stages. One or more of the stages may have DISABLE inputs 18, ISOLATE OUTPUT terminals 20 and RESET OUTPUT terminals 22. The versatility of the delay stages $D_A$ - $D_E$ is demonstrated by the interconnection illustrated in FIG. 5. For example, the output 14 of stage $D_C$ is connected back to the ISOLATE OUTPUT terminal 20 of $D_B$. The output of stage $D_D$ is capacitively coupled to output 14 of stage $D_B$ by capacitor 72, and is connected to both inputs 20 and 22 of stage $D_C$.

Figure 6:
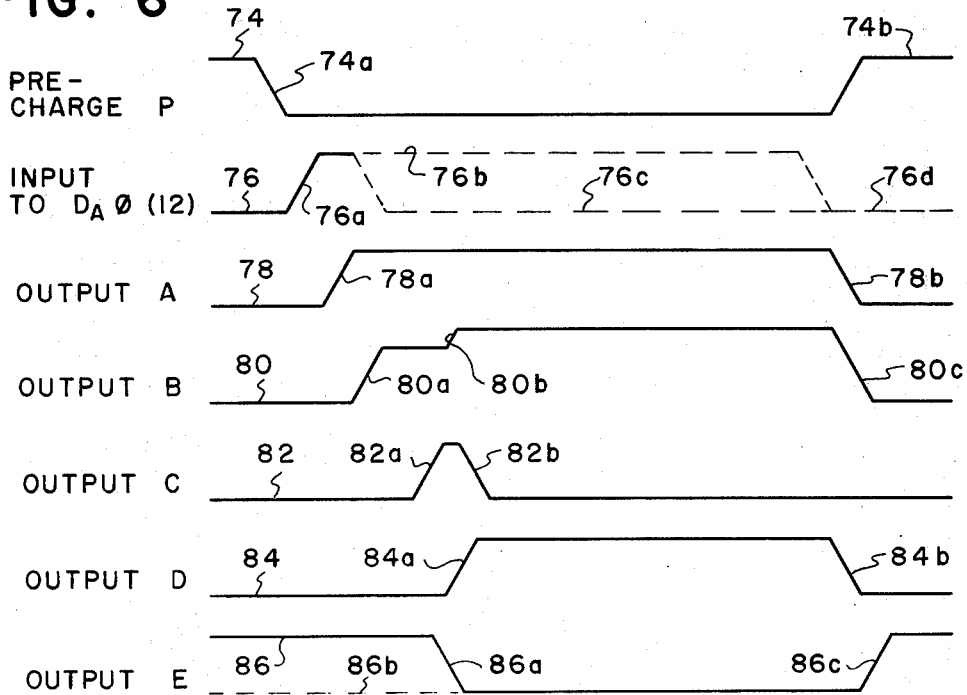
FIG. 6 is a timing diagram which serves to illustrate the operation of a clock system of FIG. 5.

The operation of the clock configuration illustrated in FIG. 5 is represented schematically in FIG. 6. The voltage of the precharge signal P with respect to time is represented by line 74, and the voltage $\phi$ on the input 12 to stage $D_A$ is represented by line 76. Outputs A, B, C, D and E from stages $D_A$, $D_B$, $D_C$, $D_D$ and $D_E$ are represented by lines 78, 80, 82, 84 and 86, respectively. The precharge signal 74 may go from high level of $V_{DD}$ to the low level of $V_{SS}$ as represented by transition 74a at any time coincident with or prior to the transition 76a of voltage on input 12 from $V_{SS}$ to $V_{DD}$. Thereafter unless inhibited by a signal on one of the inputs 18, outputs A – D will transition sequentially from $V_{SS}$ to $V_{DD}$ as represented by transitions 78a, 80a, 82a and 84a, respectively. These clock edges may then be used for any desired function, including operation of the stages $D_A$ – $D_E$, as desired. In this respect, it is important to note that once the input 12 of stage $D_A$ has gone to $V_{DD}$ for a sufficient period of time to cause transition 78a at the output of stage $D_A$, the input 12 can thereafter be at any level as represented by the dotted lines 76b and 76c, provided, of course, that the input must be at $V_{SS}$ during the period 76d when the precharge line 74 is again at $V_{DD}$ as represented by segment 74b. It will be noted that Output A remains high until it is reset by the voltage on precharge terminal 16 going high. The output of stage $D_B$ is isolated by the output transition 82a from stage $D_C$ which is applied to terminal 20. Then transition 84a at the output of stage $D_D$ capacitively boosts output B of stage $D_B$ above $V_{DD}$ as represented by transition 80b in FIG. 6. At the same time, the transition 84a of the output from stage $D_D$ both isolates and resets the output from stage $D_C$ to cause transition 82b. Outputs A, B and D are all reset to $V_{SS}$ by the precharge signal going high as represented by transitions 78b, 80c and 84b, respectively.

Delay stage $D_E$ illustrates that all inputs to a delay stage respond to the same type of clock signal and therefore that any output of any stage is basically compatible with any input of any other stage. Since clock 82a - 82b of output C is the precharge to stage $D_E$, the output E goes to $V_{SS}$ at event 86a in response to event 82a unless stage $D_E$ was previously disabled by the output of gate 71, in which case the output E would already be at $V_{SS}$ as represented by dashed line 86b. Then when the precharge P goes high, output E also goes high one delay stage later, as represented by event 86c.

From the above detailed description of preferred embodiments of the invention, it will be appreciated that various delay stages have been described which are reliable in operation and provide very fast transitions from a source supply voltage level $V_{SS}$ all the way to a drain supply voltage level $V_{DD}$ a predetermined time delay after an input signal. Additionally, the delay stages provide for a disable or inhibit function, provide for isolation of the output to permit capacitive boosting above the drain supply voltage, and provide for resetting the output to provide pulses of predetermined widths. The outputs and transition of the outputs are independent of the state of the inputs to the stage, thus providing substantially total flexibility in designing clock circuitry for controlling digital systems on a single integrated circuit chip. And yet the delay stages can be operated without consuming any static or D.C. power.

Although preferred embodiments of the invention have been described in detail, it is to be understood that various changes, substitutions and alterations can be made therein without departing from the spirit of the invention as defined by the appended claims.

What is claimed is:

1. In an MOSFET integrated circuit, the delay stage comprising;
    first and second transistors connected in series between a drain supply voltage and a source supply voltage and forming a first node therebetween,
    the gate of the first transistor forming part of a second node,
    capacitor means capacitively coupling the first node to the second node,
    an input node,
    a third transistor having a channel connecting the second node to the input node,
    the gate of the third transistor forming part of a third node,
    the gate of the second transistor forming part of a fourth node, and
    precharge circuit means for precharging the third and fourth nodes to turn the third and second transistors, respectively, on, and for discharging the second node to turn the first transistor off, and
    control circuit means for holding the voltage charge on the third node as the input node transitions from a voltage near the source supply voltage to a voltage nearer the drain supply voltage to allow the third node to be capacitively boosted and thus rapidly charge the second node substantially to the voltage at the input node and for automatically discharging the third and fourth nodes a short delay period after the rise of the voltage on the input node to turn the second and third transistors off whereby the rise in voltage on the first node will capacitively boost the voltage on the second node as a result of the capacitor means.

2. The delay stage of claim 1 further comprising:
    a fourth transistor the channel of which connects the third node to the fourth node,
    the gate of the fourth transistor being connected to receive the voltage on the input node, and
    the third node being discharged through the fourth transistor to the fourth node.

3. The delay stage of claim 1 further comprising:
    a fourth transistor the channel of which connects the third node to the fourth node,
    the gate of the fourth transistor being connected to the drain supply voltage, and
    the third node being discharged through the fourth transistor to the fourth node.

4. The delay stage of claim 1 further comprising:
    a fourth transistor the channel of which connects the third node to the fourth node,
    the gate of the fourth transistor being connected to the second node, and
    the third node being discharged through the fourth transistor to the fourth node.

5. The delay stage of claim 1 wherein the control circuit means includes:
    a fourth transistor connecting a fifth node to the drain supply voltage, the gate of the fourth transistor being connected to receive the voltage signal on the input node;
    a fifth transistor connecting the third and fourth nodes to the source supply node, the gate of the fifth transistor forming part of the fifth node whereby the fourth and fifth transistors provide a delay period after the input voltage goes high before the third and fourth nodes are discharged; and wherein
    the precharge circuit means precharges the fifth node substantially to the source supply voltage.

6. The delay stage of claim 5 wherein
    the gate of the fourth transistor is controlled by the voltage on the second node, and further comprising
    disable circuit means for discharging the third node to hold the third transistor off.

7. The delay stage of claim 5 wherein the gate of the fourth transistor is controlled by the voltage on the second node.

8. The delay stage of claim 1 further comprising:
    fourth and fifth transistors connected in series between the drain supply voltage and the source supply voltage and forming an output node therebetween, the gate of the fourth transistor forming part of the second node and the gate of the fifth transistor forming part of the fourth node.

9. The delay stage of claim 8 further comprising:
    circuit means responsive to a voltage signal occuring after the third and fourth nodes have been automatically discharged for discharging the second node to ground to turn the fourth transistor off and thereby isolate the output node from the drain supply voltage.

10. The delay stage of claim 9 further comprising:
circuit means for selectively discharging the output node to the source supply voltage while the fourth node is discharged and the fifth transistor thereby turned off.

11. The delay stage of claim 1 further comprising:
circuit means for selectively discharging the third node before the voltage on the input node transitions from the source supply voltage toward the drain supply voltage for turning the third transistor off and disabling the delay stage.

12. The delay stage of claim 11 wherein the control circuit means for discharging the fourth node is responsive to a high voltage level on the second node.

13. The delay stage of claim 1 further comprising disable circuit means for discharging the third node to hold the third transistor off.

14. In an MOSFET integrated circuit, the clock system for producing a series of clock signals which occur in predetermined time sequence comprising:
a plurality of delay stages each including
first and second transistors connected in series between a drain supply voltage and a source supply voltage and forming a first node therebetween,
the gate of the first transistor forming part of a second node,
capacitor means capacitively coupling the first node to the second node,
an input node,
a third transistor having a channel connecting the second node to the input node,
the gate of the third transistor forming part of a third node,
the gate of the second transistor forming part of a fourth node, and
precharge circuit means for precharging the third and fourth nodes to turn the third and second transistors, respectively, on, and for discharging the second node to turn the first transistor off, and
first circuit means for holding the voltage charge on the third node as the input node transitions from a voltage near the source supply voltage to a voltage nearer the drain supply voltage to allow the third node to be capacitively boosted and thus rapidly charge the second node substantially to the voltage at the input node and for automatically discharging the third and fourth nodes a short delay period after the rise of the voltage on the input node to turn the second and third transistors off, and
second circuit means forming an output node which transitions from the source supply voltage level to substantially the drain supply voltage level in response to the rise in voltage on the second node,
the output node of each delay stage being connected to an input of each succeeding stage whereby a series of output signals will be produced in predetermined time sequence in response to a rise in voltage on the input node.

15. The clock system of claim 14 wherein at least one delay stage further comprises:
fourth and fifth transistors connected in series between the drain supply voltage and the source supply voltage and forming an output node therebetween, the gate of the fifth transistor forming part of the second node and the gate of the sixth transistor forming part of the fourth node.

16. The clock system of claim 14 wherein at least one of the delay stages further comprises:
third circuit means for discharging the second node to the source supply voltage to thereby isolate the output node from the drain supply voltage, and wherein
the output node of a subsequent delay stage is connected to said third circuit means to discharge the second node.

17. The clock system of claim 16 wherein said at least one of the delay stages includes:
fourth circuit means for selectively discharging the output node to the source supply voltage while the fourth node is discharged and the second transistor thereby turned off, and wherein
the output of a subsequent delay stage is connected to said fourth circuit means for selectively discharging the output node to the source supply voltage.

18. The clock system of claim 14 wherein:
the output node of a delay stage subsequent to said first subsequent delay stage is capacitively coupled to the output of said at least one of the delay stages whereby the output of said at least one of the delay stages will be capacitively boosted above the drain supply voltage.

19. The clock system of claim 14 wherein at least one of the stages includes:
third circuit means for selectively discharging the third node before the voltage on the input node transitions from the source supply voltage toward the drain supply voltage for turning the third transistor off and disabling the delay stage.

20. In an MOSFET integrated circuit, the delay stage comprising:
an input node,
an output node,
first circuit means for producing a voltage signal at the output node a predetermined time period after a voltage signal is applied to the input node and then for positively maintaining the voltage level of the output node without regard to a subsequent change in the input node,
a first control signal node, and
second circuit means responsive to a control signal on the first control signal node for isolating the output node to permit the voltage on the output node to be changed by circuitry external to the delay stage.

21. The delay stage of claim 20 further comprising:
a second control signal node, and
third circuit means responsive to a second control signal for resetting the voltage signal produced on the output node to a different voltage level than that produced in response to a voltage signal applied to the input node.

22. In an MOSFET integrated circuit, the delay stage comprising:
an input node,
an output node,
first circuit means for producing a voltage signal at the output node a predetermined time period after a voltage signal is applied to the input node and then for positively maintaining the voltage level of the output node without regard to a subsequent change in the input node, a control signal node, and second circuit means responsive to a control signal on the control signal node for disabling the voltage signal on the input node from affecting the voltage level on the output node said predetermined time period later.

23. In an MOSFET integrated circuit having a drain supply voltage and a source supply voltage, a clock system for producing a series of clock signals which transition from a source supply voltage to a drain supply voltage comprising:

a series of delay stages each including
an input node,
an output node,
first circuit means for producing a voltage transition from the source supply voltage to the drain supply voltage at the output node a predetermined time period after a corresponding voltage transition is applied to the input node and then for preventing the state of the input node from changing the state of the output node, the output node of each delay stage being connected to the input node of the succeeding stage to produce said series of clock signals, and wherein at least one delay stage further comprises:

a first control signal node, second circuit means responsive to a control signal on the first control signal node for isolating the output node to permit the voltage on the output node to be changed by circuitry external to at least one delay stage, and wherein a voltage output from a succeeding stage is connected to the first control signal node.

24. The clock system of claim 23 wherein the voltage on the output node of a delay stage succeeding said succeeding stage is capacitively coupled to the output of said at least one delay stage to capacitively boost the output to a higher voltage.

25. In an MOSFET integrated circuit having a drain supply voltage and a source supply voltage, a clock system for producing a series of clock signals which transition from a source supply voltage to a drain supply voltage comprising:

a series of delay stages each including
an input node,
an output node,
first circuit means for producing a voltage transition from the source supply voltage to the drain supply voltage at the output node a predetermined time period after a corresponding voltage transition is applied to the input node and then for preventing the state of the input node from changing the state of the output node, the output node of each delay stage being connected to the input node of the succeeding stage to produce said series of clock signals, and wherein at least one delay stage further comprises:

a control signal node, second circuit means responsive to a control signal applied to the control signal node for resetting the voltage signal produced on the output node in response to a voltage signal applied to the input node to a different voltage level, and wherein a voltage output from a succeeding stage is connected to the control signal node.

26. In an MOSFET integrated circuit having a drain supply voltage and a source supply voltage, a clock system for producing a series of clock signals which transition from a source supply voltage to a drain supply voltage comprising:

a series of delay stages each including
an input node,
an output node,
first circuit means for producing a voltage transition from the source supply voltage to the drain supply voltage at the output node a predetermined time period after a corresponding voltage transition is applied to the input node and then for preventing the state of the input node from changing the state of the output node, the output node of each delay stage being connected to the input node of the succeeding stage to produce said series of clock signals, and wherein at least one delay stage further comprises:

a control signal node, and second circuit means responsive to a control signal on the control signal node for disabling the voltage signal on the input node from affecting the voltage level on the output node, and wherein an output from a preceeding stage is connected to the control signal node.

27. In an MOSFET integrated circuit having a drain supply voltage and a source supply voltage, a clock system for producing a series of clock signals which transition from a source supply voltage to a drain supply voltage comprising:

a series of delay stages each including
an input node,
an output node,
first circuit means for producing a voltage transition from the source supply voltage to the drain supply voltage at the output node a predetermined time period after a corresponding voltage transition is applied to the input node and then for preventing the state of the input node from changing the state of the output node, the output node of each delay stage being connected to the input node of the succeeding stage to produce said series of clock signals, and wherein at least one delay stage comprises:

a precharge input node, precharge circuit means responsive to a voltage signal on the precharge input node for resetting the output node and preparing the first circuit means for receiving a voltage signal on the input node and producing a voltage signal at the output node, and wherein the output of a delay stage is connected to the precharge input node.

* * * * *

UNITED STATES PATENT OFFICE
CERTIFICATE OF CORRECTION

PATENT NO. : 4,061,933
DATED : December 6, 1977
INVENTOR(S) : Paul R. Schroeder and Robert J. Proebsting It is certified that error appears in the above-identified patent and that said Letters Patent are hereby corrected as shown below:

Column 2, Line 34, change "conjunct" to --- conjunction ---.

Column 3, Line 7, before "terminal" insert --- input ---.

Column 4, Line 42, after "disabled" delete "from disabled".

Signed and Sealed this

Twenty-fifth Day of July 1978

[SEAL]

Attest:

RUTH C. MASON
Attesting Officer

DONALD W. BANNER
Commissioner of Patents and Trademarks